United States Patent
Kim et al.

(10) Patent No.: US 12,329,007 B2
(45) Date of Patent: Jun. 10, 2025

(54) DISPLAY PANEL

(71) Applicant: LG Display Co., Ltd., Seoul (KR)

(72) Inventors: Suphil Kim, Paju-si (KR); Youngmu Oh, Paju-si (KR); Jihoon Lee, Paju-si (KR); Changyong Gong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 679 days.

(21) Appl. No.: 17/138,044

(22) Filed: Dec. 30, 2020

(65) Prior Publication Data

US 2021/0202611 A1 Jul. 1, 2021

(30) Foreign Application Priority Data

Dec. 31, 2019 (KR) .................. 10-2019-0180129

(51) Int. Cl.
*H10K 59/88* (2023.01)
*H10K 59/122* (2023.01)
*H10K 59/35* (2023.01)

(52) U.S. Cl.
CPC ......... *H10K 59/353* (2023.02); *H10K 59/122* (2023.02); *H10K 59/88* (2023.02)

(58) Field of Classification Search
CPC ............. H01L 27/3218; H01L 27/3223; H01L 27/3246
See application file for complete search history.

(56) References Cited

U.S. PATENT DOCUMENTS

| 7,902,750 | B2* | 3/2011 | Takei | H10K 59/122 |
| | | | | 313/506 |
| 2015/0147838 | A1* | 5/2015 | Ookawara | H10K 71/00 |
| | | | | 438/34 |
| 2018/0374909 | A1* | 12/2018 | Nishikiori | H10K 59/122 |
| 2021/0193761 | A1* | 6/2021 | Gee | H01L 27/3216 |

FOREIGN PATENT DOCUMENTS

KR 10-1703175 B1 2/2017

* cited by examiner

*Primary Examiner* — Chad M Dicke
*Assistant Examiner* — Valerie N Newton
(74) *Attorney, Agent, or Firm* — Birch, Stewart, Kolasch & Birch, LLP

(57) ABSTRACT

A display panel is discussed. The display panel includes a substrate, sub-pixels disposed on the substrate along pixel rows and pixel columns, light emitting layers provided on each of the sub-pixels, dummy patterns disposed to correspond to the sub-pixels, a hank disposed between the dummy patterns, and a connection pattern connecting at least two of the dummy patterns, disposed with the light emitting layers outputting light of a same color among the dummy patterns, to each other, wherein each of the light emitting layers is disposal by being extended from each of the sub-pixels to each of the dummy patterns corresponding to each of the sub-pixels.

19 Claims, 8 Drawing Sheets

DISPLAY PANEL

CROSS-REFERENCE TO RELATED APPLICATIONS

This application claims the priority benefit of Korean Patent Application No. 10-2019-0180129 filed on Dec. 31, 2019 in the Republic of Korea, the entire contents of which are hereby expressly incorporated by reference for all purposes as if fully set forth herein into the present application.

BACKGROUND OF THE INVENTION

Field of the Invention

The present disclosure relates to a display panel.

Description of the Related Art

As the information society evolves, various types of display devices have been developed. Recently, various display devices such as a liquid crystal display (LCD), a plasma display panel (PDF), and an organic light emitting display (OLED) have been utilized.

The organic light emitting element constituting an organic light emitting display is a self-luminous type, and does not require a separate light source, thereby reducing thickness and weight of a display device. In addition, the organic light emitting display exhibits high quality properties such as low power consumption, high luminance, and high response speed.

Recently, a technique for providing a light emission layer of an organic light emitting element through a solution process by using an inkjet device has been developed. The solution process is performed in a way of dropping a solution to form a light emitting layer to a preset area and then diving the solution. At this time, the light emission layer may not be properly formed in the pixels provided in an outer part due to dewetting which occurs in the outer part of the solution, thereby causing pixel defects.

SUMMARY OF THE INVENTION

In exemplary embodiments, a dummy pattern is formed on an outer part of a display area where pixels are disposed, and a light emission layer is formed from the display area to the dummy pattern through a solution process, thereby providing a display device that prevents the light emission non-uniformity problem of pixels due to de wetting.

The exemplary embodiments provide the display panel that forms a connection pattern connecting dummy patterns, and further improves the light emission non-uniformity problem caused by dewetting through the connection pattern.

A display panel according to the exemplary embodiments of the present disclosure includes a substrate; sub-pixels disposed on the substrate along pixel rows and pixel columns; light emitting layers provided on each of the sub-pixels; dummy patterns disposed to correspond to the sub-pixels; a bank disposed between the dummy patterns; and a connection pattern connecting at least two of the dummy patterns, disposed with the light emitting layers outputting light of a same color among tire dummy patterns, to each other, wherein each of the light emitting layers is disposed by being extended from each of the sub-pixels to each of the dummy patterns corresponding to each of the sub-pixels.

The display device according to exemplary embodiments can prevent pixel defects in tire outer part due to dewetting that occurs in tire outer part of the solution when the light emitting layer is formed using the solution process.

DETAILED DESCRIPTION OF THE EMBODIMENTS

Figure 1:
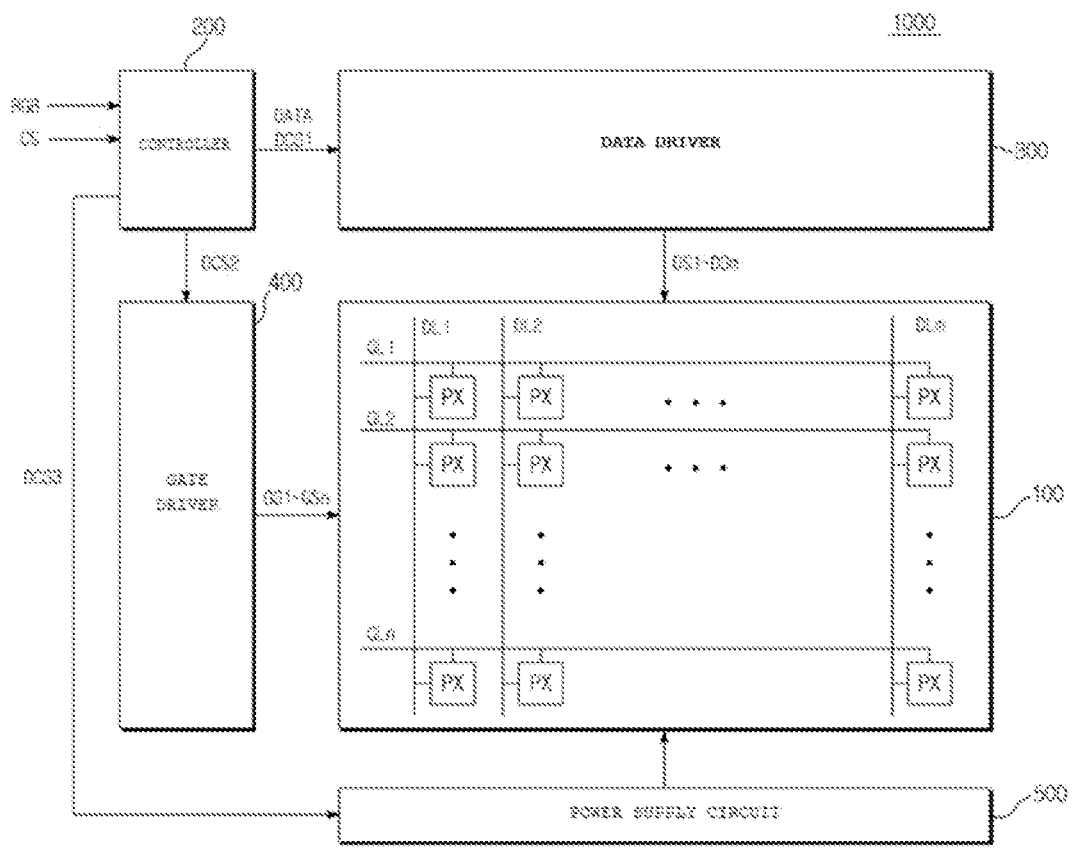
FIG. 1 is a block diagram showing a configuration of a display device according to an exemplary embodiment of the present disclosure.

Hereinafter, exemplary embodiments will be described with reference to the drawings. In this specification, when a first component (or area, layer, part, etc.) is referred to as being "on", "connected to", or "coupled with" a second component, it means that the first component can be directly connected to/coupled to the second component, or a third component can be disposed between the first and second components.

The same reference numerals refer to the same components. In addition, in tire drawings, the thickness, proportion, and dimensions of the components are exaggerated for effective description of the technical content, "And/or" includes all combinations of one or more of which the associated configurations can be defined.

Although the terms "first", "second", etc. can be used herein to describe various components, these components should not be limited by these terms. These terms are only used for the purpose of distinguishing one element from another element and may not define any order. For example, the first component can be referred to as a second component without departing from the scope of the present exemplary embodiments, and similarly, the second component can be referred to as a first component. As used herein, the singular forms are intended to include the plural forms as well, unless the context clearly indicates otherwise.

The terms "below", "on a lower side", "above", "on an upper side", etc. are used to describe the association of the components shown in the drawings. The terms are relative concepts and are explained based on the directions indicated in the drawings.

It will be further understood that the terms "comprise", "include", "have", etc. when used in this specification, specify the presence of stated features, integers, steps, operations, elements, components, and/or combinations of them but do not preclude the presence or addition of one or more oilier features, integers, steps, operations, elements, components, and/or combinations thereof.

FIG. 1 is a block diagram showing a configuration of a display device according to an exemplary embodiment. All the components of the display device according to all embodiments of the present disclosure are operatively coupled and configured.

Referring to FIG. 1, a display device 1 includes a timing controller 10, a gate driver 20, a data driver 30, a power supply unit 40, and a display panel 50.

The timing controller 10 can receive an linage signal RGB and a control signal CS from the outside. The image signal RGB can include a plurality of gray scale data. The control signal CS can include, for example, a horizontal synchronization signal, a vertical synchronization signal, and a main clock signal.

The timing controller 10 processes the image signal RGB and the control signal CS to be suitable for operating conditions of the display panel 50, thereby generating and outputting image data DATA, a gate drive control signal CONT1, a data drive control signal CONT2, and a power supply unit control signal CONT3.

The gate driver 20 can be connected to pixels PX of the display panel 50 through a plurality of gate lines GL1 to GLn, where n can be a positive number such as a positive integer. The gate driver 20 can generate gate signals on the basis of the gate drive control signal CONT1 output from the timing controller 10. The gate driver 20 can provide the generated gate signals to the pixels PX through the plurality of gate lines GL1 to GLn.

The data, driver 30 can be connected to the pixels PX of the display panel 50 through a plurality of data lines DL1 to DLm, where m can be a positive number such as a positive integer. The data driver 30 can generate data signals on the basis of the image data and the data drive control signal CONT2 output from the timing controller 10. The data driver 30 can provide the generated data signals to the pixels PX through the plurality of data lines DL1 to DLm.

In various exemplars' embodiments, the data driver 30 can be further connected to the pixels PX of the display panel 50 through a plurality of sensing lines (or reference lines) SL1 to SLm. The data driver 30 can provide a reference voltage (or a sensing voltage, an initialization voltage) to the pixels PX through the plurality of sensing lines SL1 to SLm, or can sense states of the pixels PX on the basis of the electrical signal fed back from the pixels PX.

The power supply unit 40 can be connected to the pixels PX of the display panel 50 through a plurality of power lines PL1 and PL2. The power supply unit 40 can generate a driving voltage to be provided to the display panel 50 on the basis of the power supply unit control signal CONT3. The driving voltage can include, for example, a high potential driving voltage ELVDD and a low potential driving voltage ELVSS. The power supply unit 40 can provide the generated driving voltages ELVDD and ELVSS to the pixels PX through the corresponding power lines PL1 and PL2.

A plurality of pixels PX (or referred to as sub-pixels) is disposed on the display panel 50. The pixels PX can be disposed in a matrix form on the display panel 50, for example.

Each pixel PX can be electrically connected to a corresponding gate line and data line. These pixels PX can emit light with luminance corresponding to the gate signal and the data signal, which are respectively supplied through the gate lines GL1 to GLn and the data lines DL1 to DLm.

Each pixel PX can display any one of the first to third colors. In an exemplary embodiment, each pixel PX can display any one of red, green, and blue colors, in another exemplary embodiment, each pixel PX can display any one of cyan, magenta, and yellow colors. In various exemplary embodiments, the pixels PXs can be configured to display any one of four or more colors. For example, each pixel PX can also display any one of red, green, blue, and white colors.

The timing controller 10, the gate driver 20, tire data driver 30, and the power supply unit 40 can be each composed of a separate integrated circuit (IC) or by an integrated circuit in which at least a part thereof is combined. For example, at least one of the data driver 30 and the power supply unit 40 can be composed of an integrated circuit combined with the timing controller 10.

In addition, although the gate driver 20 and the data driver 30 are shown as separate components from the display panel 50 in FIG. 1, at least one of the gate driver 20 and the data, driver 30 can be constituted by the in panel method formed integrally with the display panel 50. For example, the gale driver 20 can be integrally formed with the display panel 50 according to the gate in panel (GIF) method.

Figure 2:
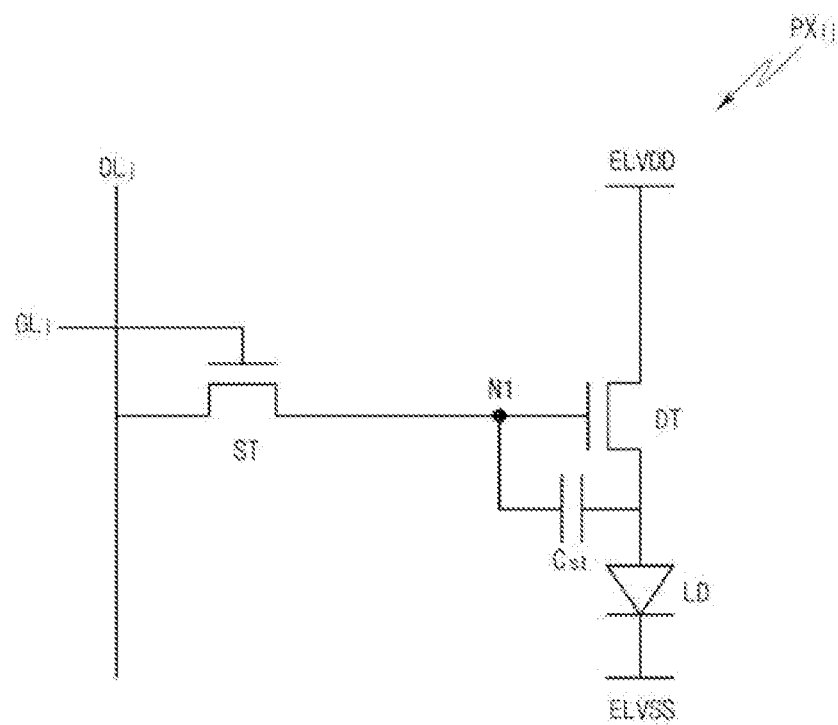
FIG. 2 is a circuit diagram showing an example of tire pixel shown in FIG. 1.

FIG. 2 is a circuit diagram showing an example of the pixel shown in FIG. 1. Each of at least one or more pixels PX of FIG. 1 can have the configuration of the pixel shown in FIG. 2. Particularly, FIG. 2 shows an example of a pixel PXij connected to the i-th gate line GLi and the j-th data line DLj.

Referring to FIG. 2, tire pixel PXij includes a switching transistor ST, a driving transistor DT, a storage capacitor Cst, and a light emitting element LD.

The first electrode (for example, source electrode) of the switching transistor ST is electrically connected to the j-th data line DLj, and the second electrode (for example, drain electrode) is electrically connected to the first node N1. The gate electrode of the switching transistor ST is electrically connected to the i-th gate line GLi. The switching transistor ST is turned on when a gate-on level gate signal is applied to the i-th gate line GLi, and transmits a data signal applied to the j-th data line DLj to the first node N1.

The first electrode of the storage capacitor Cst is electrically connected to the first node N1, and the second electrode can be configured to receive a high potential driving voltage ELVDD. The storage capacitor Cst can charge a voltage corresponding to a difference between the voltage applied to the first node N1 and tire high potential driving voltage ELVDD.

The first electrode (for example, source electrode) of the driving transistor DT is configured to receive the high potential driving voltage ELVDD, and the second electrode (for example, drain electrode) is electrically connected to the first electrode of the light emitting element LD (for example, an anode electrode). The gate electrode of the driving transistor DT is electrically connected to the first node N1. The driving transistor DT is turned on when the voltage of the gate-on level is applied through the first node N1, and can control the amount of driving current flowing through the light emitting element LD in response to the voltage provided to the gate electrode.

The light emitting element LD outputs light corresponding to the driving current. The light emitting element LD can output light corresponding to any one of red, green, blue, and white colors. The light emitting element LD can be an organic light emitting diode (OLED), or an ultra-small inorganic-light emitting diode having a size ranging from micro to nanoscale, but tire present exemplary embodiment is not limited thereto. Hereinafter, the technical idea of the present exemplary embodiment will be described with reference to the exemplary embodiment in which the fight emitting element LD is formed of an organic light emitting diode.

In the present exemplary embodiment, the structure of the pixels PXij is not limited to that shown in FIG. 2. According to the exemplary embodiment, the pixels PXij compensate for a threshold voltage of the driving transistor DT, or can further include at least one element for initializing the voltage of the gate electrode of the driving transistor DT and/or the voltage of the anode electrode of the light emitting element LD.

FIG. 2 shows an example in which the switching transistor ST and the driving transistor DT are NMOS transistors, but the present exemplary embodiment is not limited thereto. For example, at least some or all of the transistors constituting each pixel PXij can be composed of PMOS transistors. In various exemplary embodiments, each of the switching transistor ST and the driving transistor DT can be implemented by a low temperature polysilicon (LTPS) thin film transistor, an oxide thin film transistor, or a low temperature poly crystalline oxide (LTPO) thin film transistor.

Figure 3:
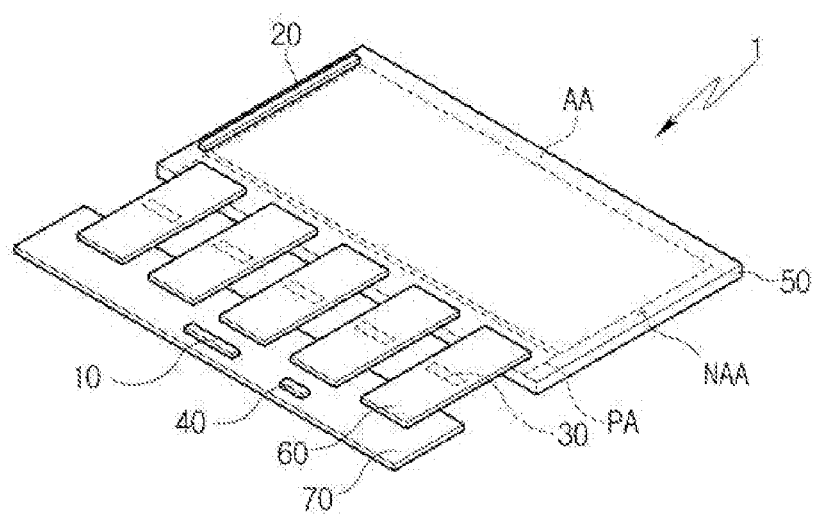
FIG. 3 is a schematic perspective view of the display panel shown in FIG. 1.

FIG. 3 is a schematic perspective view of the display panel shown in FIG. 1. Referring to FIG. 3, in association with FIGS. 1 and 2, components of the display device 1 will be described in more detail.

The display device 1 can be implemented in various forms. For example, the display-device 1 can be implemented in a rectangular plate shape. Flow ever, the present exemplary embodiment is not limited thereto, and the display device 1 can have various shapes such as a square shape, a circular shape, an elliptical shape, and a polygonal shape, and apart of the corner can be formed as a curved surface or can have a shape in winch thickness is changed in at least one area. In addition, all or part of the display device 1 can have flexibility.

The display panel 50 includes a display area AA and a non-display area NAA. The display area AA is an area in which the pixels PX are disposed, and can be referred to as an active area. The non-display area NAA can be disposed around the display area AA. For example, the non-display area NAA can be disposed along the border of the display area AA. The non-display area NAA can comprehensively refer to areas other than the display area DA on the display panel 50, and can be referred to as a non-active area.

As a driver for driving the pixels PX, for example, a gate driver 20 can be provided in the non-display area NAA. The gate driver 20 can be disposed adjacent to one side or both sides of the display-area AA in the non-display area NAA. As shown in FIG. 3, the gate driver 20 can be provided in a non-display area. NAA of the display panel 50 by the gate in panel method. However, in another exemplary embodiment, the gate driver 20 is made of a driving chip and mounted on a flexible film and the like, and can be attached to the non-display area NAA by a tape automated bonding (TAB) method.

A plurality of pads can be provided in the non-display area NAA. The pads are not covered by an insulating layer, and are exposed outside the display panel 50 to be electrically connected to a data driver 30, a circuit board 70, etc., which will be described later.

The display panel 50 can include wirings for supplying electrical signals to the pixels PX. The wirings can include, for example, gate lines GL1 to GLn, data lines DL1 to DLm, and power lines PL1 and PL2.

The power lines PL1 and PL2 are electrically connected to the power supply unit 40 (or the timing controller 10) through the connected pads, and can provide the high potential driving power ELVDD and the low potential driving power ELVSS, provided from the power supply unit 40 (or the timing controller 10), to the pixels PX.

The flexible film 60 can have one end attached to the pad area PA of the display panel 50 and the other end attached to the circuit board 70, thereby electrically connecting the display panel 50 and the circuit board 70 to each other. The flexible film 60 can include a plurality of wirings for electrically connecting the pads provided in the pad area PA and the wirings of tire circuit board 70 to each other. In an exemplary embodiment, the flexible film 60 can be attached on fire pads through an anisotropic conducting film (ACF).

When the data driver 30 is made of a driving chip, the data driver 30 can be mounted on tire flexible film 60 in fire chip on film (COF) or chip on plastic (COP) method. The data driver 30 can generate a data signal on the basis of the image data and the data drive control signal CONT2, which are received from the timing controller 10, and can output the data signal to the data, lines DL1 to DLm through the connected pads.

A plurality of circuits implemented with driving chips can be mounted on fire circuit board 70. The circuit board 70 can be a printed circuit board or a flexible printed circuit board, but the type of the circuit board 70 is not limited thereto.

The circuit board 70 can include the timing controller 10 and the power supply unit 40 mounted in the form of an integrated circuit. In FIG. 3, the timing controller 10 and the power supply unit 40 are shown as separate components, but the present exemplary embodiment is not limited thereto. For example, in various exemplary embodiments, the power supply unit 40 can be integrally provided with the timing controller 10 or the timing controller 10 can be configured to perform fire function of the power supply unit 40.

Figure 4:
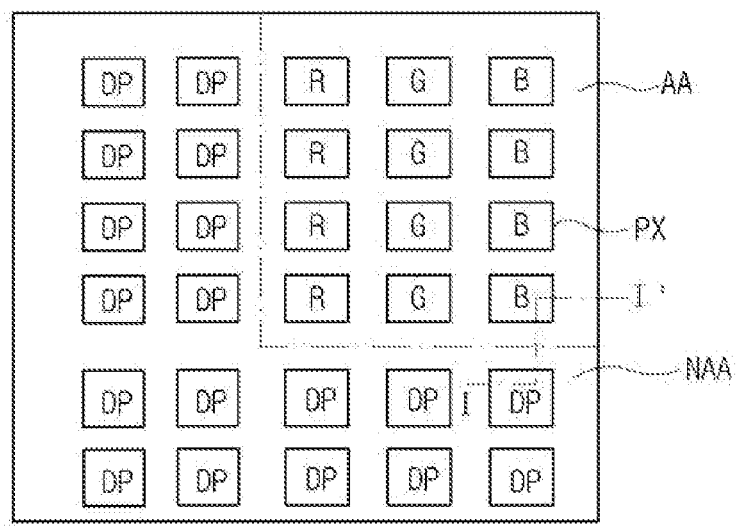
FIG. 4 is a schematic plan view of an enlarged part of a display area and a non-display area according to an exemplary embodiment of the present disclosure.
Figure 5:
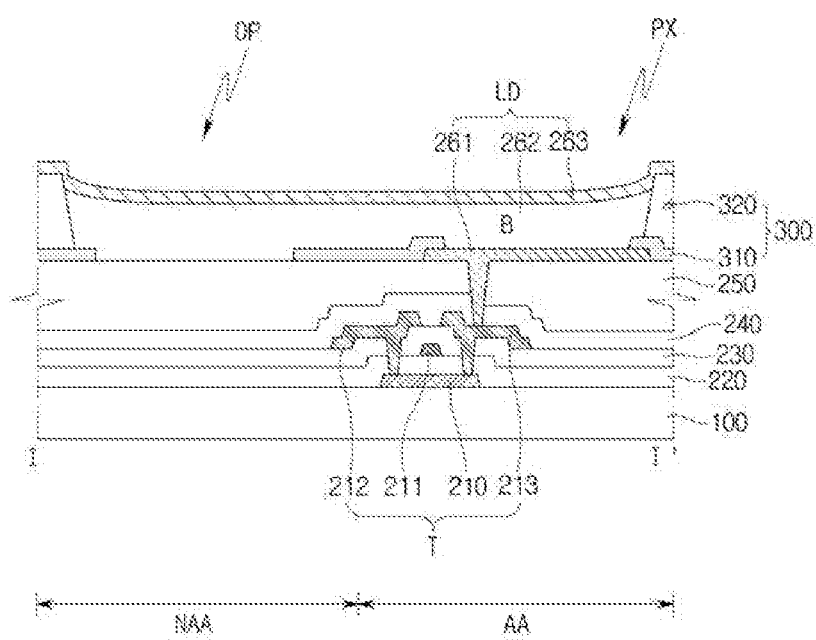
FIG. 5 is a cross-sectional view taken along line I-I' in FIG. 4.

FIG. 4 is a schematic plan view of an enlarged part of a display area and a non-display area according to an exemplary embodiment. FIG. 5 is a cross-sectional view taken along line IT in FIG. 4.

Referring to FIG. 4, in the display area AA, the pixels PXs can be disposed in a matrix form by being arranged by a plurality of pixel rows and a plurality of pixel columns. At this time, tire same pixels PX are disposed in one pixel column. In one pixel row, R, G, and B pixels can be repeatedly disposed in sequence (i.e., stripe type). However, the present exemplary embodiment is not limited to the illustrated one, and in various other exemplary embodiments, R, G, B, and G pixels can be repeatedly disposed in one pixel row in sequence (i.e., pentile type).

Dummy patterns DP can be formed in the non-display area NAA. The dummy patterns DP can be disposed in one or both ends of tire pixel rows and pixel columns, which are disposed in tire display area AA, in alignment with a corresponding pixel row and/or pixel column.

In FIG. 4, the dummy patterns DP are shown as having a square shape or a rectangular shape. However, the shape of tire dummy patterns DP is not limited thereto. In various exemplary embodiments described below, tire dummy patterns DP can have a pattern in which a plurality of dummy patterns DP shown in FIG. 4 are merged.

Hereinafter, a laminated structure of the display panel 50 will be described.

Referring to FIG. 5, a substrate 100 is a base substrate of tire display panel 50, and can be a translucent substrate. The substrate 100 can be a rigid substrate including glass or tempered glass, or a flexible substrate made of plastic.

In an exemplary embodiment, a buffer layer can be formed on the substrate 100. The buffer layer can prevent ions or impurities from diffusing from tire substrate 100, and can block moisture penetration.

The substrate 100 can include a display area AA and a non-display area NAA A circuit element layer and a light emitting element layer can be formed on the display area AA on the substrate 100.

The circuit element layer can include circuit elements (e.g., a switching transistor ST, a driving transistor DT, a storage capacitor Cst, etc.) and signal lines composing the pixel PXij. When a buffer layer is formed, the circuit element layer can be formed on the buffer layer.

First, an active pattern 210 can be provided on the substrate 100. The active pattern 210 can be provided of a silicon-based semiconductor material or an oxide-based semiconductor material.

A gate insulating layer 220 can be formed on the active pattern 210, and a gate electrode 211 can be provided on the gate insulating layer 220. An interlayer insulating layer 230 can be formed on the gate electrode 211, and a source electrode 212 and a drain electrode 213 can be provided on the interlayer insulating layer 230. The source electrode 212 and the drain electrode 213 can be connected to the active pattern 210 through a contact hole passing through tire interlayer insulating layer 230 and the gate insulating layer 220.

The source electrode 212, the drain electrode 213, the gate electrode 211, and the active pattern 210 corresponding thereto can compose tire transistor T. The transistor T can be, for example, a driving transistor DT or a switching transistor ST. In FIG. 5, tire driving transistor DT in which tire chain electrode 213 is connected to a first electrode 261 of the light emitting element LD is shown as an example.

A passivation layer 240 can be formed on the source electrode 212 and the drain electrode 213. The passivation layer 240 is an insulating layer for protecting the lower elements, and can be formed of an inorganic material or an organic material.

An overcoat layer 250 can be formed on the passivation layer 240. The overcoat layer 250 can be a planarization film for alleviating a level difference of an underlying structure.

Circuit elements such as various signal lines and capacitors can be further provided on the circuit element layer. The signal lines can include, for example, a gate line GL, a data line DL, etc. described with reference to FIGS. 1 and 2.

The light emitting element layer is formed on the overcoat layer 250, and includes light emitting elements LD. The light emitting element LD includes a first electrode 261, a light emitting layer 262, and a second electrode 263. The first electrode 261 can be an anode electrode and the second electrode 263 can be a cathode electrode.

The first electrode 261 is provided on the overcoat layer 250. Tire first electrode 261 is connected to the drain electrode 213 of the transistor T through a via hole penetrating the overcoat layer 250 and the passivation layer 240.

A bank 300 is further provided on the overcoat layer 250. In the display area AA, the bank 300 can be provided to cover a part of the edge of the first electrode 261.

In various exemplary embodiments, the bank 300 can be composed of a first bank 310 having hydrophilic properties and a second bank 320 having hydrophobic properties. Die second bank 320 can be patterned through a photolithography process after applying a solution mixed a hydrophobic material such as fluorine with an organic insulating material having hydrophilicity. A hydrophobic material such as fluorine can move to an upper part of the second bank 320 by light emitted during the photolithography process, and the upper part of the second bank 320 can have hydrophobic properties. However, the present exemplary embodiment is not limited thereto, and the entire part of the second bank 320 can be provided to have hydrophobic properties.

In an exemplary embodiment, the first bank 310 can be provided to have a smaller thickness than that of the second bank 320, and can be provided to have a wider lateral width than that of the second bank 320. The first bank 310 can be disposed in a grid form to surround each pixel PX, and tire second bank 320 can be disposed to surround each pixel column. When the light emitting layer 262 to be described later is formed by a solution process, the solution can be easily spread in tire pixel column direction by the first bank 310 having hydrophilicity, and mixing of the solution in between the pixel columns can be prevented by the second bank 320 having hydrophobicity.

The light emitting layer 262 is formed on the first electrode 261. The tight emitting layer 262 is not covered by the bank 300, and is formed on a part of the exposed first electrode 261. For example, the fight emitting layer 262 is surrounded by the bank 300.

The light emitting layer 262 can have a multi-layer thin film structure including a light generating layer. For example, the light emitting layer 262 can include a hole transport layer (HTL), an organic light emitting layer, and an electron transport layer (ETL). In addition, the light emitting layer 262 can further include a hole injection layer (HIL), a hole blocking layer (HBL), an electron injection layer (EIL), and an election blocking layer (EBL).

In the present exemplary embodiment, the light emitting layer 262 cart be formed by the solution process using an inkjet device, etc. In particular, the light emitting layer 262 can be formed in a single solution process for pixels PX of the same color, disposed in the same pixel column, in tins exemplars' embodiment, the inkjet device can move on the first electrodes 261 disposed in the same pixel column, and drop the solutions. When the dropped solutions are dried, a single integrated fight emitting layer 262 is formed for the pixel columns.

When the light emitting layer 262 is formed by foe solution process, a difference in thickness can occur between the center area of the fight emitting layer 262 and the edge area adjacent to the bank 300 by the tension force between the solution and the bank 300. For example, the light emitting layer 262 can be formed in a concave shape having the thinnest thickness in foe center and tire thickest thickness in the area in contact with the bank 300. However, the present exemplary embodiment is not limited thereto. For example, in various other exemplary embodiments, structures for improving thickness uniformity of the light emitting layer 262 can be disposed, and the light emitting layer 262 can have a uniform thickness in the entire area.

The second electrode 263 is provided on the light emitting layer 262 and the bank 300. For example, the second electrode 263 can be provided to cover the light emitting layer 262 and the bank 300.

An encapsulation layer can be formed on the second electrode 263. The encapsulation layer serves to prevent external moisture from penetrating foe light emitting layer 262. The encapsulation layer can be formed of an inorganic insulating material, or can be formed of a structure in which inorganic insulating materials and organic insulating materials are alternately stacked, but is not limited thereto.

A circuit element layer, a light emitting layer 262, a second electrode 263, a bank 300, and an encapsulation layer can be provided on the non-display area NAA on foe substrate 100.

The circuit element layer can have the same structure as foe circuit element layer formed in the display area AA, and can be formed through the same single process. However, at least some or all of signal lines and circuit elements may not be provided in the circuit element layer in the non-display area NAA.

The bank 300 is provided, on the overcoat layer 250 of the circuit element layer. In the non-display area NAA, the bank 300 can be a definition layer defining the shape of the dummy pattern DP.

The light emitting layer 262 is further formed on the overcoat layer 250. The light emitting layer 262 is formed on the overcoat layer 250 exposed without being covered by the bank 300. For example, tire light emitting layer 262 is formed in the dummy pattern DP defined by the bank 300, and is surrounded by the bank 300.

Unlike the display area AA, the circuit element layer in the non-display area NAA is not provided with at least some or all of signal lines and circuit elements. In addition, as shown, tire dummy pattern DP does not include the first electrode 261. Accordingly, the light emitting layer 262 composing the dummy pattern DP does not emit light.

The light emitting layer 262 of the dummy patterns DP can be formed by a single solution process with the light emitting layer 262 of corresponding pixel columns. The inkjet device moves along one pixel column from the display area AA to the non-display area NAA, and the solutions can be dropped to the pixels PX disposed in the corresponding pixel column, and the dummy patterns DP disposed adjacent to tire corresponding pixel column. Thereafter, when the dropped solutions are dried, tire light emitting layer 262 can be integrally formed with respect to the pixels PX and the dummy patterns DP.

As described above, the thickness of the light emitting layer 262 can be different between the center area of the light emitting layer 262 and the edge area adjacent to the bank 300 by the tension force between tire solution and tire bank 300.

A second electrode 263 and an encapsulation layer can be provided on the light emitting layer 262. The second electrode 263 and the encapsulation layer can be provided through a single process with the same structure as the second electrode 263 and the encapsulation layer provided in the display area AA. For example, the second electrode 263 and the encapsulation layer can be provided in a structure extending from the display area AA to the non-display area NAA. However, in various exemplary embodiments, the second electrode 263 may not be provided in the non-display area NAA.

In the structure of the display panel 50 as described above, the dummy pattern DP is provided to solve the light emission imbalance between the center part and the outer part of the pixel column in the display area AA. As described above, the light emitting layer 262 can be formed through a single solution process, for one pixel column and dummy patterns DP corresponding thereto. When tire solution dries, dewetting can occur in which the solution separates and retracts from tire outer part thereof. When the degree of dewetting is large, pixel defects can occur because the light emitting layer 262 is not correctly formed in predetermined pixels disposed on the outer part of the pixel column (i.e., both ends of the pixel column).

In order to prevent such a problem, the solution can be dropped to the dummy pattern DP beyond the pixel column area. Then, since dewetting occurs in the dummy pattern DP, the pixel defects in the display area AA can be prevented.

In the following exemplary embodiments, a structure is proposed, in which pixel defects caused by dewetting can be more effectively prevented through the dummy pattern DP.

Figure 6:
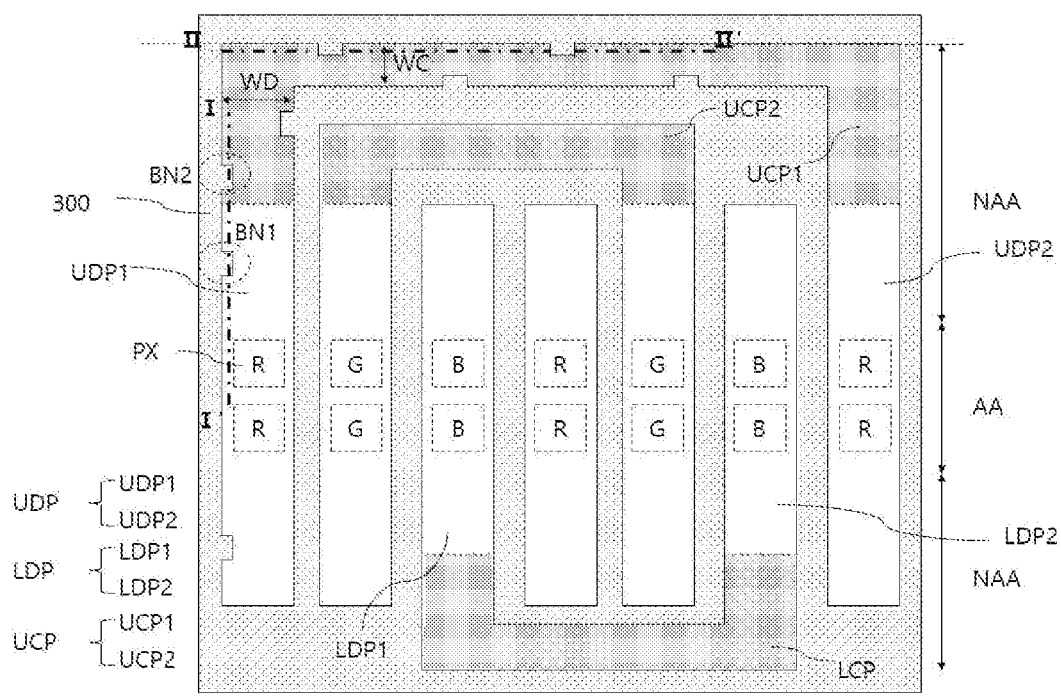
FIG. 6 is a view showing tire display panel according to exemplary embodiments of tire present disclosure.

FIG. 6 is a view showing tire display panel according to exemplary embodiments of the present disclosure.

Referring to FIGS. 1 to 6, the display panel 50 includes the display area AA and the non-display area NAA.

A plurality of sub-pixels PX is disposed in the display area AA. The plurality of sub-pixels PX can include a first sub-pixel provided to output first light, a second sub-pixel provided to output second light, and a third sub-pixel provided to output third light.

According to the exemplary embodiments, the first light can be red light the second light can be green light, and the third light can be blue light, but the present disclosure is not limited thereto.

The sub-pixels PX can be disposed along pixel row's and pixel columns. According to the exemplary embodiments, sub-pixels outputting light of the same color can be disposed in one pixel column.

A light emitting element LD can be disposed in each of the sub-pixels PX. According to the exemplary embodiments, the light emitting layer 262 can be disposed in each of the sub-pixels PX.

Dummy patterns UDP and LDP can be disposed in the non-display area NAA. According to the exemplary embodiments, the dummy patterns UDP and LDP can be disposed in alignment with the pixel columns.

An upper dummy pattern UDP can be disposed on one side (for example, an upper part) of the sub-pixels PX disposed in one pixel column, and a lower dummy pattern LDP can be disposed on the other side (for example, a lower part) of the sub-pixels PX disposed in one pixel column. For example, a plurality of sub-pixels PX can be disposed between the upper dummy pattern UDP and the lower dummy pattern LDP.

The light emitting layer 262 formed on the sub-pixels PX can be formed according to a solution process, and the light emitting layer 262 formed on the sub-pixels PX can be disposed by being extended to the dummy patterns UDP and LDP beyond tire sub-pixels PX. For example, the light emitting layer 262 disposed in the sub-pixels PX disposed in one pixel column can be disposed by being extended on the dummy patterns UDP and LDP corresponding onto the sub-pixels disposed in the pixel column.

Therefore, since dewetting occurs in the dummy pattern DP, there is an effect in which the pixel defects in the display area AA can be prevented.

According to the exemplary embodiments of the present disclosure, connection patterns UCP and LCP can be additionally disposed in the non-display area NAA.

The connection patterns UCP and LCP can connect at least two dummy patterns in which light emitting layers outputting light of the same color are disposed among dummy patterns UDP and LDP. For example, one connection pattern can connect at least two dummy patterns in which a light emitting layer outputting red light is disposed.

Accordingly, the light emitting layers disposed on at least two dummy patterns connected by the connection patterns UCP and LCP can be disposed by being extended onto the connection patterns UCP and LCP. Furthermore, the light emitting layers disposed on at least two dummy patterns connected by the connection patterns UCP and LCP can be connected to each other on the connection patterns UCP and LCP.

For example, according to the exemplary embodiments of the present disclosure, the solution dropped on the sub-pixel PX can be spread to the dummy patterns UDP and LDP beyond the sub-pixel PX, and can be further spread to the connection patterns UCP and LCP connecting between the dummy patterns. Accordingly, an effect can be increased, in which pixel defects due to dewetting are prevented.

According to the exemplary embodiments, the width WC of the connection patterns UCP and LCP can be narrower than the width WD of the dummy patterns UDP and LDP.

According to the exemplary embodiments, the connection patterns UCP and LCP can be extended in a direction crossing (for example, orthogonal to) the direction in which the dummy patterns UDP and LDP are extended. For example, the dummy patterns UDP and LDP can be disposed to be extended in the pixel column direction, and the connection patterns UCP and LCP can be disposed to be extended in the pixel row direction.

For example, the display panel 50 according to the exemplary embodiments of the present disclosure includes the connection patterns UCP and LCP, hut since the connection patterns UCP and LCP are disposed to be extended in the pixel row direction, an increase in the thickness of the bezel area can be maximally reduced.

According to the exemplary embodiments, the connection patterns UCP and LCP can include an upper connection pattern UCP connecting at least two upper dummy patterns UPD and a lower connection pattern LCP connecting at least two lower dummy patterns LDP.

For example, as shown in FIG. 6, a light emitting layer outputting red light and extending from a red sub-pixel can be disposed on the first upper dummy pattern UDP1 and the second upper dummy pattern UDP2, and the first upper connection pattern UCP1 can connect the first upper dummy pattern UDP1 and the second upper dummy pattern UDP2 to each other. Accordingly, a light emitting layer outputting red light and disposed on the first upper dummy pattern UDP1 and the second upper dummy pattern UDP2 can be disposed by being extended into the first upper connection pattern UCP1.

Meanwhile, the connection patterns UCP and LCP can connect three or more dummy patterns UDP and LDP to each other.

According to the exemplary embodiments, one connection pattern can be disposed to surround the other connection pattern. For example, the first upper connection pattern UCP1 can be disposed to surround the second upper connection pattern UCP2.

The connection patterns UCP and LCP can be disposed separately from each other. According to the exemplary embodiments, the bank 300 can be disposed between the connection patterns UCP and LCP. For example, the second bank 320 can be disposed between the connection patterns UCP and LCP.

According to the exemplary embodiments, the bank 300 can be disposed so that at least a part thereof is extended into the dummy patterns UDP and LDP. Accordingly, a first bottleneck part BN1 can be provided on the dummy patterns UDP and LDP. Since the area of the dummy patterns UDP and LDP around the first bottleneck part BN1 is narrowed due to the first bottleneck part BN1, the solution can stay around the first bottleneck part BN1 as much as possible.

According to the exemplary embodiments, a plurality of first bottleneck part BN1 can be provided, and the sizes and shapes of the plurality of first bottleneck parts BN1 can be different from each other.

According to the exemplary embodiments, the bank 300 can be disposed so that at least a part thereof is extended into the connection patterns UCP and LCP. Accordingly, a second bottleneck part BN2 can be provided in the connection patterns UCP and LCP. Since the area of the connection patterns UCP and LCP around the second bottleneck part BN2 is narrowed due to the second bottleneck part BN2, the solution can stay around the second bottleneck part RN2 as much as possible.

According to the exemplary embodiments, a plurality of second bottleneck part BN2 can be provided, and the sizes and shapes of the plurality of second bottleneck pails BN2 can be different from each other.

Meanwhile, according to the exemplary embodiments, the bank 300 may not encroach into the display area AA. For example, the bank 300 can be disposed along the boundary of the display area AA, and can be disposed not to be overlapped with the display area AA. When the bank 300 encroaches the display area AA, drying of the solution on the display area AA can be unbalanced, thereby possibly causing another pixel defect.

The display panel according to the exemplary embodiments of the present disclosure includes dummy patterns UDP and LDP and connection patterns UCP and LCP connecting the dummy patterns UDP and LDP to each other, thereby having an effect in which drying properties can be improved and pixel defects due to dewetting can be reduced.

Figure 7:
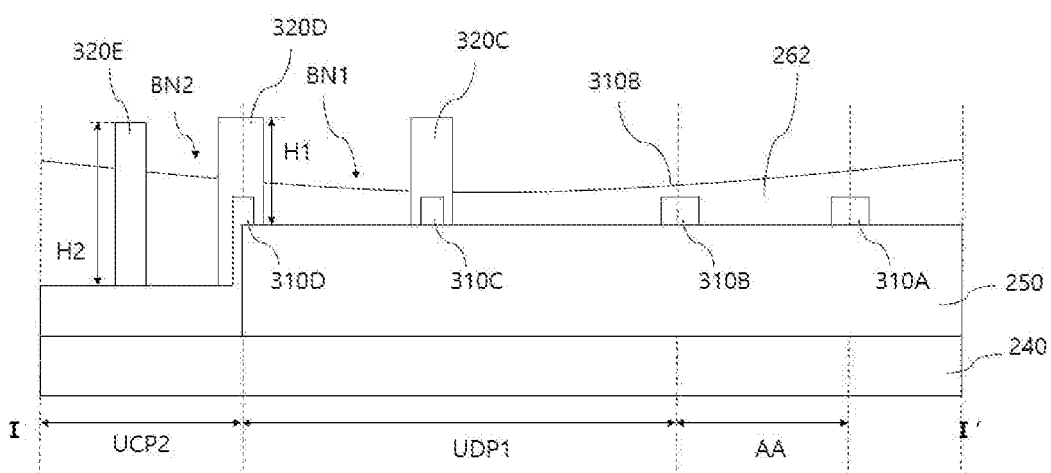
FIG. 7 is a view showing a cross section taken along tire line I-I' in FIG. 6.

FIG. 7 is a view showing a cross section taken along the line I-I' in FIG. 6.

Referring to FIGS. 1 to 7, the passivation layer 240 is disposed on the display area AA, the first upper dummy pattern UBP1, and the second upper connection pattern UCP2.

The overcoat layer 250 can be disposed on the passivation layer 240. Tire overcoat layer 250 can be disposed on the first upper dummy pattern UDP1 and the display area AA, but may not be disposed on the second upper connection pattern UCP2.

The light emitting layer 262 can be disposed on the second upper connection pattern UCP2, the first upper dummy pattern UDP1, and the display area AA. According to the exemplary embodiments, the light emitting layer 262 can be disposed to cover the first hanks 310A, 310B, 310C, and 310D, but can be disposed at a lower position than the second banks 320B, 320C, 320D, and 320E. According to the exemplary embodiments of the present disclosure, the light emitting layer 262 is disposed by being extended not only into the display area AA but also into the second upper connection pattern UCP2 and the first upper dummy pattern UDP1, and thus the pixel defects due to dewetting phenomenon can be reduced.

The first upper dummy pattern UDP1 can be disposed by being extended from the display area AA.

A first bank 310B can be disposed between the first upper dummy pattern UDP1 and the display area AA. According to the exemplary embodiments, the light emitting layer formed on the display area AA can be disposed by being extended into the first upper dummy pattern UDP1, and in this case, the light emitting layer can be disposed beyond the first bank 310B on the first upper dummy pattern UDP1.

The first bank 310C and the second bank 320C can be disposed on the first upper dummy pattern UDP1. As described with reference to FIG. 6, the first bottleneck part BN1 can be provided by the first bank 310C and the second bank 320C. For example, the second bank 320C can be disposed so that at least a part thereof is overlapped with the first upper dummy pattern UDP1.

The overcoat layer 250 is not disposed on the second upper connection pattern UCP2. A step due to the absence of the overcoat layer 250 can occur between the second upper connection pattern UCP2 and the first upper dummy pattern UDP1.

The first bank 310D can be disposed on the passivation layer 240 of the second upper connection pattern UCP2. According to the exemplary embodiments, the first bank 310D can be disposed by being extended on the second upper connection pattern UCP2 and the first upper dummy pattern UDP1.

The second bank 320D can be disposed to surround the first bank 310D, and the second bank 320D can be disposed by being extended on the first upper dummy pattern UDP1.

The second bank 320E can be disposed on the second upper connection pattern UCP2, and the second bottleneck part BN2 can be provided by the second bank 320E.

As described above, a step due to the absence of the overcoat layer 250 can occur between the second upper connection pattern UCP2 and the first upper dummy pattern UDP1, and accordingly, the height H2 of the second bank 320E disposed on the second upper connection pattern UCP2 can be greater than the height H1 of the second bank 320D or 320C disposed on the first upper dummy pattern UDP1.

Figure 8:
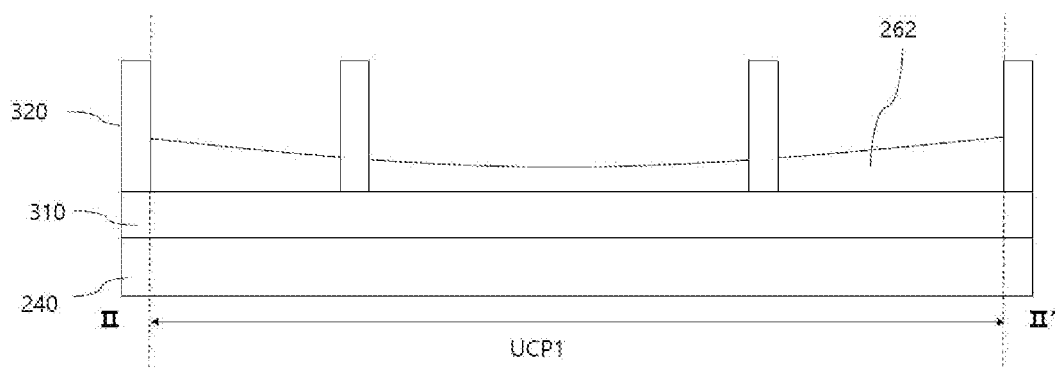
FIG. 8 is a view showing a cross section taken along tire line II-II' in FIG. 6.

FIG. 8 is a view showing a part taken along the line II-II' in FIG. 6.

Referring to FIGS. 1 to 8, the overcoat layer is not disposed on the first upper connection pattern UCP1. For example, in the first upper connection pattern UCP1, the first bank 310 can be disposed on the passivation layer 240, and the plurality of second banks 320 can be disposed on the first bank 310.

The plurality of second banks 320 disposed on the first upper connection pattern UCP1 can provide the second bottleneck part BN2 described above. The area between the second banks 320 can be defined as the second bottleneck part BN2.

According to the exemplary embodiments, the height, width, and shape of each of the plurality of second banks 320 disposed on the first upper connection pattern UCP1 can be different, but are not limited thereto.

The light emitting layer 262 can be disposed on the first upper connection pattern UCP1. According to the exemplary embodiments, the light emitting layer 262 can be disposed to cover the first bank 310, but can be disposed at a lower position than the second banks 320. According to the exemplary embodiments of the present disclosure, since the light emitting layer 262 is disposed by being extended to the connection pattern as well as the display area AA, the pixel defects due to dewetting can be reduced.

It will be understood that those skilled in the art to which the present disclosure pertains can implement the present disclosure in other specific forms without departing from the technical spirit or essential features thereof. Therefore, the exemplary embodiments described above are to be understood in all respects as illustrative and not restrictive. Tire scope of the present disclosure is indicated by the following claims rather than the above detailed description, and all changes or modifications derived from the meaning and scope of the claims and equivalent concepts should be interpreted as being included in the claims of the present disclosure.

What is claimed is:

1. A display panel comprising:
   sub-pixels disposed on a substrate along pixel rows and pixel columns, wherein same color sub-pixels are disposed in one pixel column, and first sub-pixels, second sub-pixels and third sub-pixels are respectively disposed in sequence in one pixel row;
   light emitting layers provided on each of the sub-pixels;
   dummy patterns disposed to correspond to the sub-pixels;
   a bank disposed between the dummy patterns; and
   a connection pattern connecting at least two of the dummy patterns to each other, the connection pattern and the at least two of the dummy patterns being formed with a light emitting layer corresponding to a group of sub-pixels configured to output light of a same color,
   wherein the light emitting layer corresponding to the group of sub-pixels overlaps with the connection pattern and the at least two dummy patterns,
   wherein each of the light emitting layers is disposed by being extended from one of the sub-pixels to a corresponding dummy pattern among the dummy patterns,
   wherein the dummy patterns include first dummy patterns disposed to correspond to the first sub-pixels configured to output light of a same first color, second dummy patterns disposed to correspond to the second sub-pixels configured to output light of a same second color, and third dummy patterns disposed to correspond to the third sub-pixels configured to output light of a same third color,
   wherein the connection pattern includes a first connection pattern connecting the first dummy patterns corresponding to the first sub-pixels configured to output light of the same first color, a second connection pattern connecting the second dummy patterns corresponding to the second sub-pixels configured to output light of the same second color, and a third connection pattern connecting the third dummy patterns corresponding to the third sub-pixels configured to output light of the same third color,
   wherein the first connection pattern is disposed to surround the second connection pattern, and
   wherein the first connection pattern and the second connection pattern are formed in a first non-display area on a first side of the display panel, and the third connection pattern is formed on a second non-display area on a second side of the display panel opposite the first side.

2. The display panel of claim 1, wherein the light emitting layers disposed on at least two of the dummy patterns are disposed by being extended onto the connection pattern.

3. The display panel of claim 2, wherein the light emitting layers disposed on at least two of the dummy patterns are connected to each other on the connection pattern.

4. The display panel of claim 1, wherein a width of the dummy patterns is greater than a width of the connection pattern.

5. The display panel of claim 1, wherein the bank includes:
   a first bank having hydrophilicity; and
   a second bank provided on the first bank and provided with at least one area thereof having hydrophobicity.

6. The display panel of claim 5, wherein the second bank is disposed so that at least a part of the second bank is extended into the dummy patterns and the connection pattern.

7. The display panel of claim 6, wherein a height of the second bank disposed on the connection pattern is greater than a height of the second bank disposed on the dummy pattern.

8. The display panel of claim 1, wherein the light emitting layer corresponding to the group of sub-pixels continuously extends across with the connection pattern, the at least two dummy patterns, and the group of sub-pixels.

9. The display panel of claim 1, wherein at least one of the first connection pattern and the second connection pattern includes two bend portions.

10. The display panel of claim 1, wherein at least one of the first connection pattern and the second connection pattern includes a 90 degree bend.

11. The display panel of claim 1, wherein at least one of the first connection pattern and the second connection pattern is connected between two different columns of subpixels corresponding to a same color.

12. The display panel of claim 1, wherein at least one of the first connection pattern and the second connection pattern includes a bottleneck portion configured to narrow a width of the at least one of the first connection pattern and the second connection pattern.

13. The display panel of claim 12, wherein the bottleneck portion corresponds to a bank protrusion.

14. A display panel comprising:
sub-pixels disposed on a substrate along pixel rows and pixel columns, wherein same color sub-pixels are disposed in one pixel column, and first sub-pixels, second sub-pixels and third sub-pixels are respectively disposed in sequence in one pixel row;
light emitting layers provided on each of the sub-pixels;
dummy patterns disposed to correspond to the sub-pixels;
a bank disposed between the dummy patterns; and
a connection pattern connecting at least two of the dummy patterns to each other, the connection pattern and the at least two of the dummy patterns being formed with a light emitting layer corresponding to a group of sub-pixels configured to output light of a same color,
wherein the light emitting layer corresponding to the group of sub-pixels overlaps with the connection pattern and the at least two dummy patterns,
wherein each of the light emitting layers is disposed by being extended from one of the sub-pixels to a corresponding dummy pattern among the dummy patterns,
wherein the dummy patterns include upper dummy patterns disposed at a first end of the display panel and lower dummy patterns disposed at a second end of the display panel,
wherein the connection pattern includes:
a first upper connection pattern connecting the upper dummy patterns corresponding to the first sub-pixels configured to output light of the same first color;
a second upper connection pattern connecting the upper dummy patterns corresponding to the second sub-pixels configured to output light of the same second color; and
a lower connection pattern connecting the lower dummy patterns corresponding to the third sub-pixels configured to output light of the same third color,
wherein the first upper connection pattern is disposed to surround the second upper connection pattern, and
wherein the first connection pattern and the second connection pattern are formed in a first non-display area on a first side of the display panel, and the lower connection pattern is formed on a second non-display area on a second side of the display panel opposite the first side.

15. The display panel of claim 14, wherein at least two of the upper dummy patterns and at least two of the lower dummy patterns are disposed in the pixel columns different from each other.

16. The display panel of claim 14, wherein the upper connection pattern, the at least two of the upper dummy patterns and the light emitting layers outputting the light of the same color among the upper dummy patterns are integrally formed with each other from a same layer.

17. The display panel of claim 14, wherein the lower connection pattern, the at least two of the lower dummy patterns and the light emitting layers outputting the light of the same color among the lower dummy patterns are integrally formed with each other from a same layer.

18. The display panel of claim 14, wherein at least one of the first upper connection pattern, the second upper connection portion and the lower connection pattern includes a bottleneck portion configured to narrow a width of the at least one of the first upper connection pattern, the second upper connection pattern and the lower connection pattern.

19. The display panel of claim 18, wherein the bottleneck portion corresponds to a bank protrusion.

* * * * *